(12) United States Patent
Chen et al.

(10) Patent No.: US 9,723,746 B2
(45) Date of Patent: Aug. 1, 2017

(54) SLIDE RAIL ASSEMBLY

(71) Applicants: KING SLIDE WORKS CO., LTD., Kaohsiung (TW); KING SLIDE TECHNOLOGY CO., LTD., Kaohsiung (TW)

(72) Inventors: Ken-Ching Chen, Kaohsiung (TW); Shun-Ho Yang, Kaohsiung (TW); Chien-Li Huang, Kaohsiung (TW); Chun-Chiang Wang, Kaohsiung (TW)

(73) Assignees: King Slide Works Co., Ltd., Kaohsiung (TW); King Slide Technology Co., Ltd., Kaohsiung (TW)

( * ) Notice: Subject to any disclaimer, the term of this patent is extended or adjusted under 35 U.S.C. 154(b) by 162 days.

(21) Appl. No.: 14/665,023

(22) Filed: Mar. 23, 2015

(65) Prior Publication Data
US 2016/0278522 A1 Sep. 29, 2016

(51) Int. Cl.
| H05K 7/00 | (2006.01) |
| H05K 7/14 | (2006.01) |
| A47B 88/407 | (2017.01) |
| A47B 88/43 | (2017.01) |

(52) U.S. Cl.
CPC ......... *H05K 7/1489* (2013.01); *A47B 88/407* (2017.01); *A47B 88/43* (2017.01)

(58) Field of Classification Search
CPC ....... A47B 88/08; A47B 46/00; H05K 7/1489
USPC .................. 248/221.11; 211/195; 312/334.4
See application file for complete search history.

(56) References Cited

U.S. PATENT DOCUMENTS

| 6,554,142 | B2 | 4/2003 | Gray | |
| 6,655,534 | B2 | 12/2003 | Williams et al. | |
| 7,188,916 | B2 | 3/2007 | Silvestro et al. | |
| 7,281,694 | B2 | 10/2007 | Allen et al. | |
| 8,292,382 | B2 * | 10/2012 | Cheng | H05K 7/1489 312/334.4 |
| 9,258,923 | B2 * | 2/2016 | Chen | H05K 7/1489 |
| 9,313,914 | B2 * | 4/2016 | Judge | H05K 7/1489 |
| 9,504,181 | B2 * | 11/2016 | Chen | H05K 7/1489 |
| 2009/0283652 | A1 * | 11/2009 | Chen | H05K 7/1489 248/298.1 |
| 2014/0217049 | A1 * | 8/2014 | Chen | H05K 7/1489 211/195 |

* cited by examiner

*Primary Examiner* — Anita M King
(74) *Attorney, Agent, or Firm* — Rosenberg, Klein & Lee

(57) ABSTRACT

A slide rail assembly includes a first rail, a second rail, a bracket base, and a bracket. The first rail defines a channel. The second rail is movably connected to the first rail and is longitudinally displaceable relative to the first rail in the channel of the first rail. The bracket base is connected to the first rail. The bracket is movably connected to the bracket base. When displaced in an extending direction from a retracted position toward an extended position relative to the first rail, the second rail drives the first rail to displace the bracket base from a first position to a second position relative to the bracket.

14 Claims, 9 Drawing Sheets

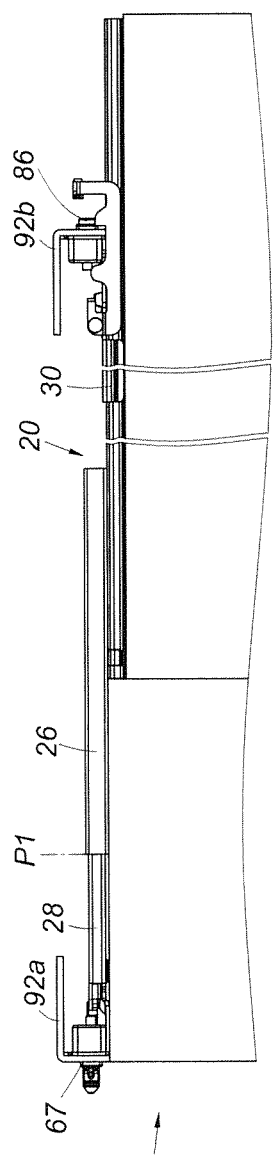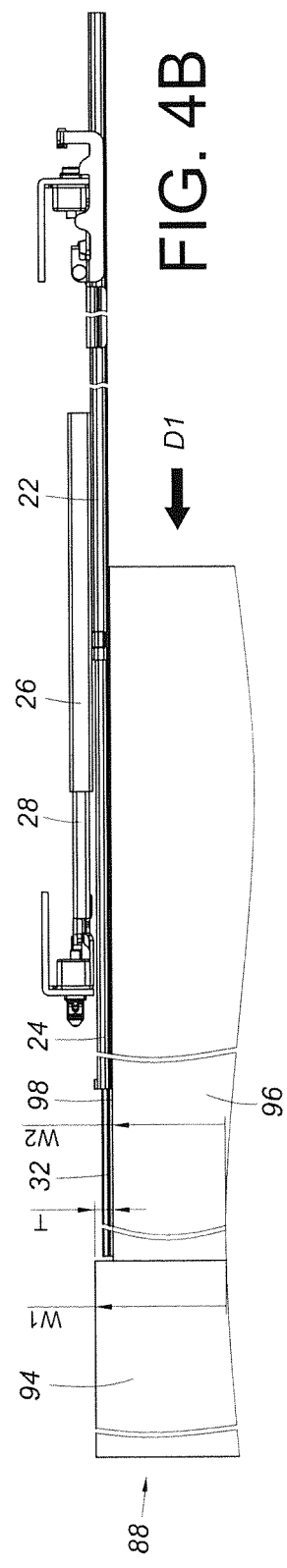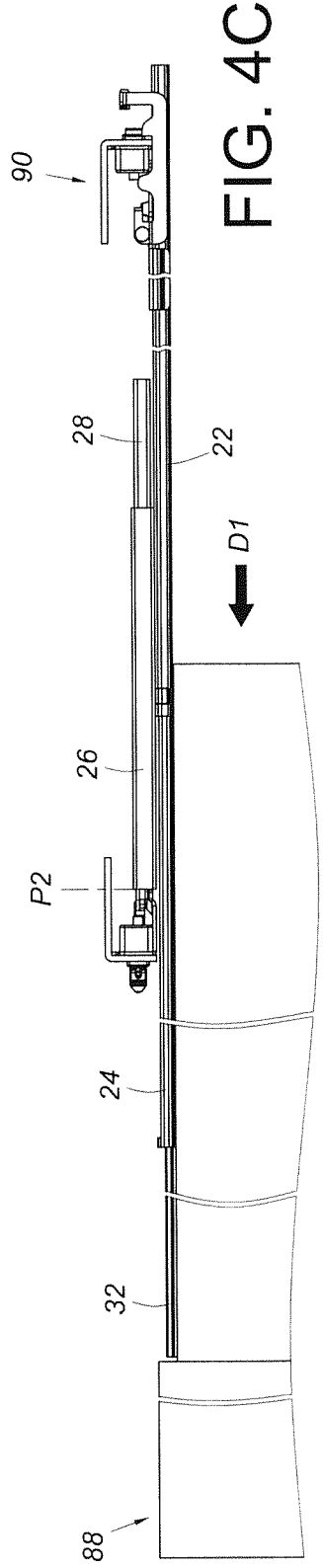

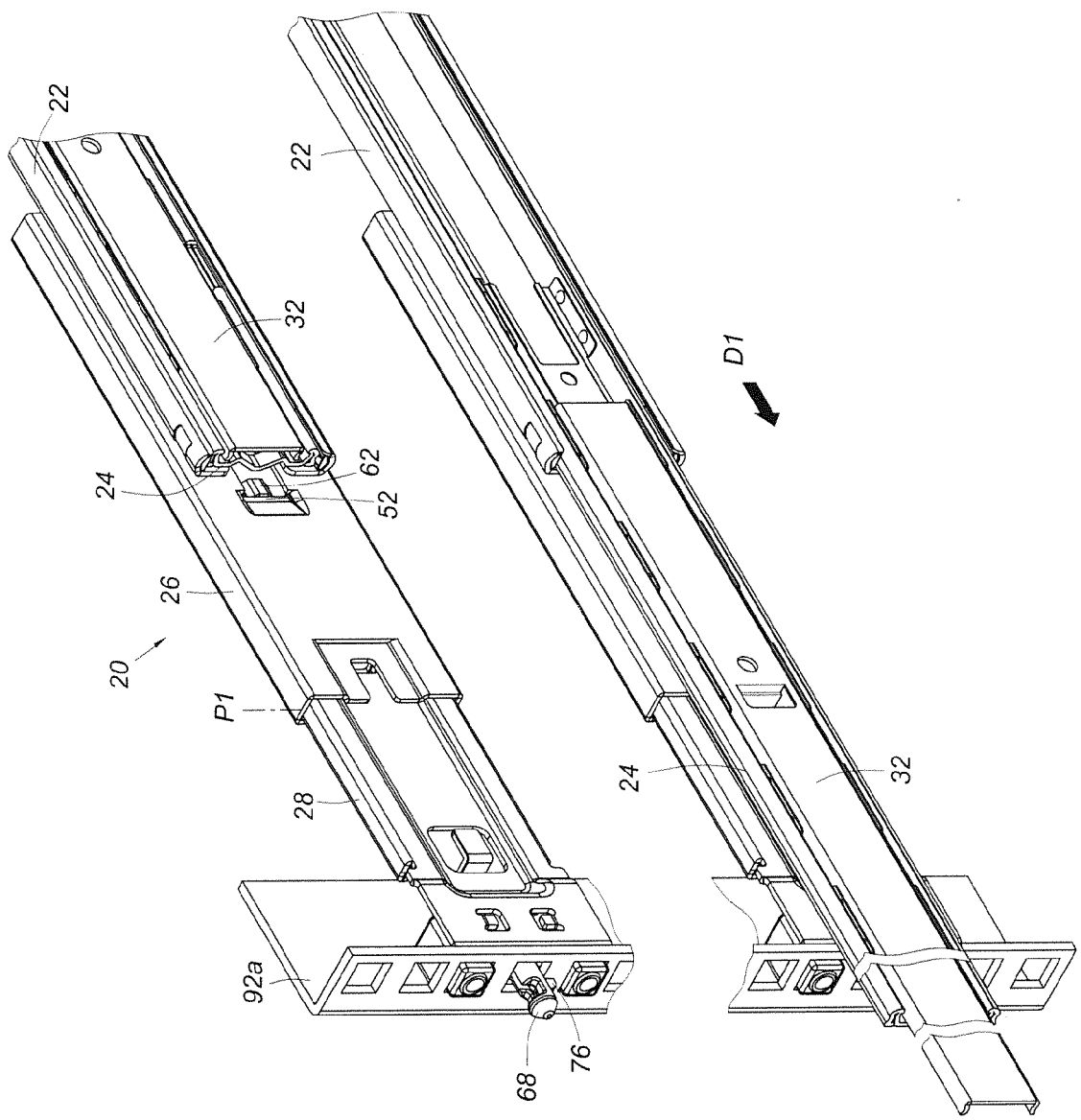

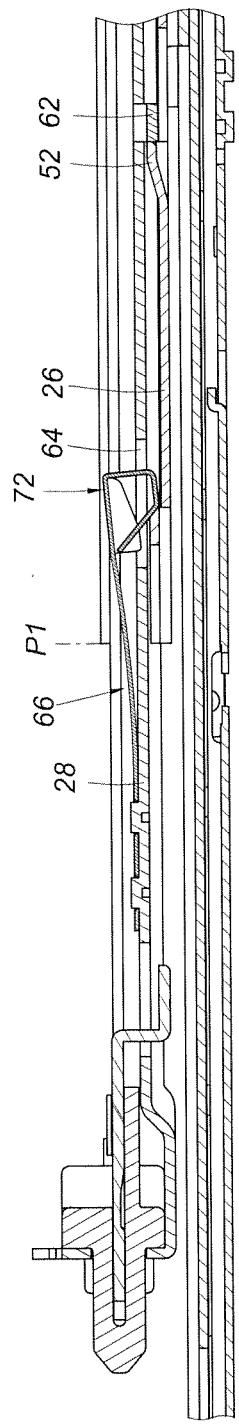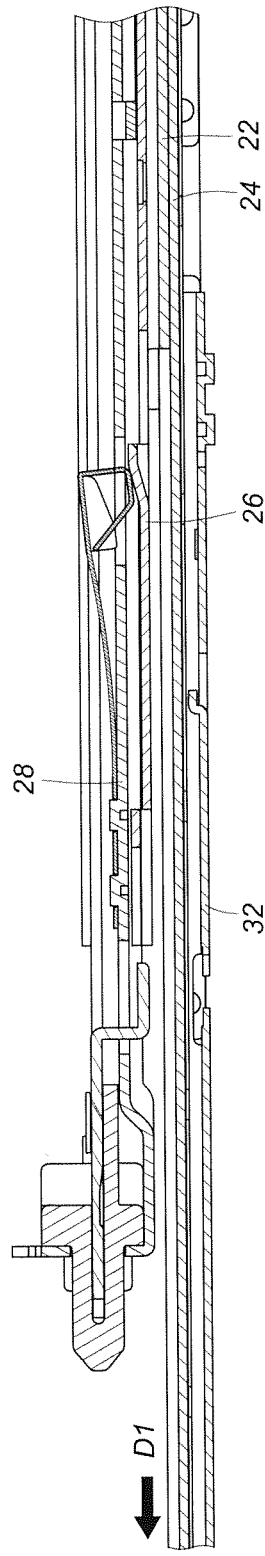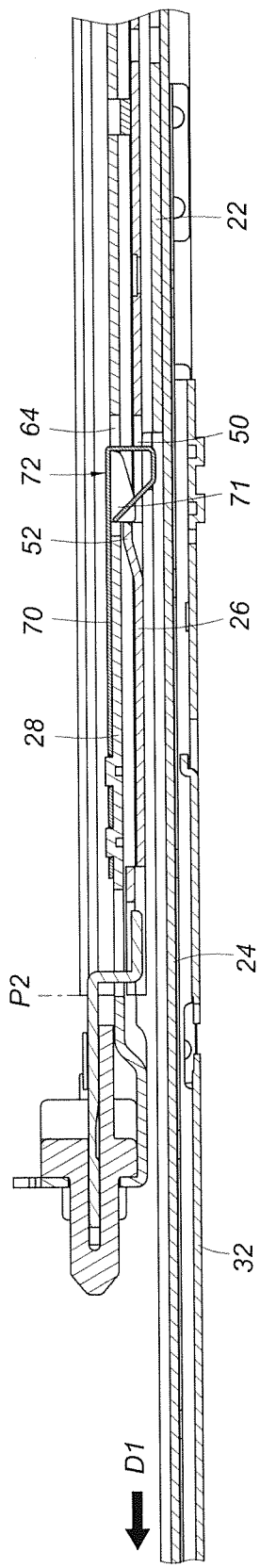

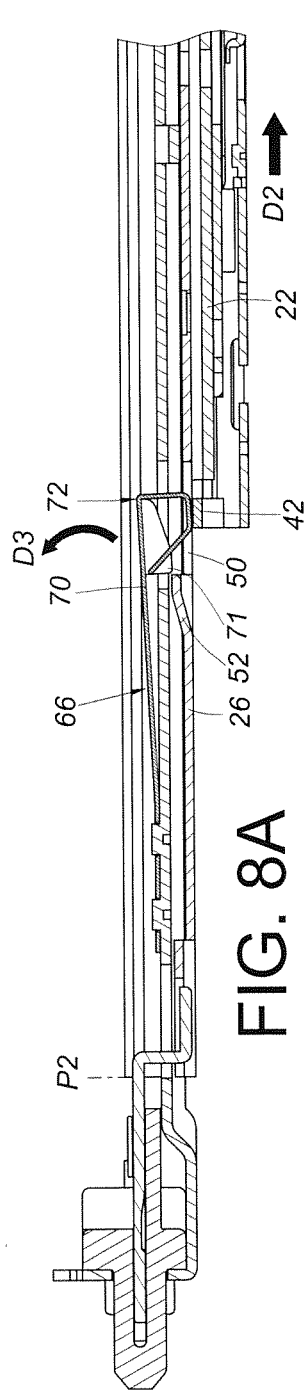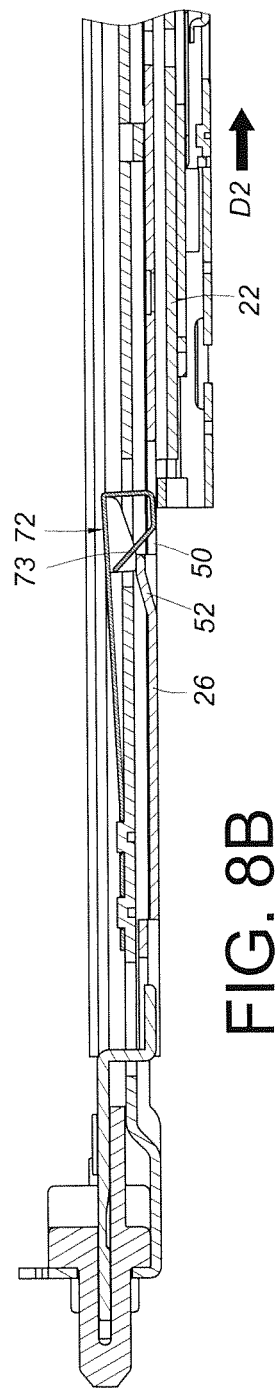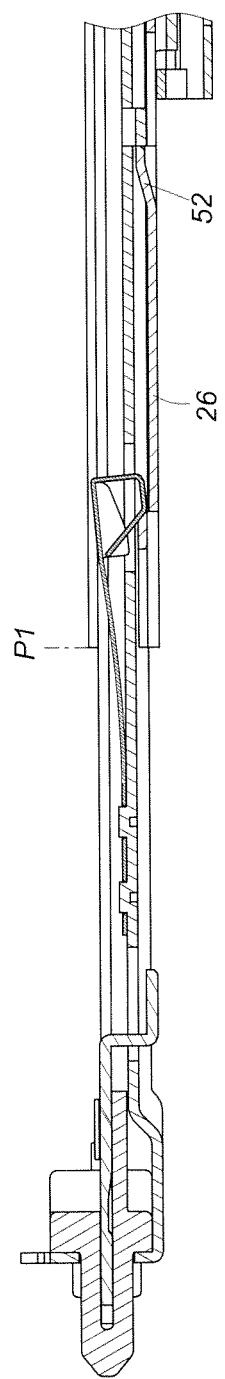

SLIDE RAIL ASSEMBLY

FIELD OF THE INVENTION

The present invention relates to a slide rail assembly and more particularly to a slide rail assembly in which a rail and a bracket base can be displaced relative to a bracket in order to increase the distance by which the rail can be displaced.

BACKGROUND OF THE INVENTION

U.S. Pat. No. 7,281,694 B2 discloses a conventional slide rail assembly applicable to the chassis of a server and to a rack whose left and right sides are each provided with a pair of posts. Take one of the two pairs of posts for example. The pair of posts are spaced apart by a predetermined distance depending on the depth of the rack. The slide rail assembly is mounted between the pair of posts and includes a first rail, a second rail, a third rail, a front bracket, and a rear bracket. The first rail has a front end and a rear end. The second rail is movably connected to the first rail. The third rail is movably connected to the second rail. The front bracket is fixedly connected to the front end of the first rail, and the rear bracket is fixedly connected to the rear end of the first rail. The slide rail assembly is mounted to the pair of posts via the front bracket and the rear bracket respectively. The disclosure of the foregoing patent is incorporated herein by reference.

While the aforesaid slide rail assembly is applicable to the chassis of a conventional server, the current trend of server development is toward high-density servers and has given rise to the emergence of chassis different from the conventional ones, such as T-shaped chassis. It is therefore imperative to design slide rail assemblies which can work with such server chassis and feature an increase in the maximum displacement of rails.

SUMMARY OF THE INVENTION

The present invention relates to a slide rail assembly in which a rail and a bracket base can be displaced relative to a bracket.

According to one aspect of the present invention, a slide rail assembly includes a first rail, a bracket base, a first bracket, and a second rail. The bracket base is connected to the first rail. The first bracket is movably connected to the bracket base. The second rail is movably connected to the first rail and longitudinally displaceable relative to the first rail, and the second rail is able to drive the first rail to displace the bracket base relative to the first bracket. Preferably, the first rail defines a channel; the second rail is longitudinally displaced in the channel of the first rail between a retracted position and an extended position relative to the first rail; and in the course in which the second rail is displaced relative to the first rail from the retracted position toward the extended position relative to the first rail, the second rail drives the first rail to displace the bracket base from a first position to a second position relative to the first bracket. Preferably, the first rail has a front portion and a rear portion, the bracket base is connected to the first rail at a position adjacent to the front portion of the first rail, and the slide rail assembly further includes a second bracket movably connected to the first rail at a position adjacent to the rear portion of the first rail.

According to another aspect of the present invention, a slide rail assembly adapted to mount a chassis to a rack is provided, wherein the rack includes a first post and a second post. The slide rail assembly includes a first rail, a second rail, a third rail, a bracket base, a first bracket, and a second bracket. The first rail has a front portion and a rear portion and defines a channel. The second rail is movably connected to the first rail and can be longitudinally displaced in the channel of the first rail between a retracted position and an extended position relative to the first rail. The third rail is movably connected to the second rail and is mounted with the chassis. The bracket base is connected to the first rail at a position adjacent to the front portion of the first rail. The first bracket is movably connected to the bracket base and is mounted to the first post. The second bracket is movably connected to the first rail at a position adjacent to the rear portion of the first rail and is mounted to the second post. In the course in which the third rail is pulled out relative to the first rail, the third rail drives the second rail into displacement relative to the first rail from the retracted position toward the extended position, and during the displacement, the second rail drives the first rail to displace the bracket base from a first position to a second position relative to the first bracket. Preferably, the chassis includes a first portion and a second portion, the first portion has a greater width than the second portion, and the third rail is mounted to a lateral side of the second portion of the chassis.

According to yet another aspect of the present invention, a slide rail assembly adapted to mount a chassis to a rack is provided, wherein the rack includes a first post and a second post. The slide rail assembly includes a first rail, a second rail, a third rail, a bracket base, a first bracket, and a second bracket. The first rail has a front portion and a rear portion. The second rail is longitudinally movably connected to the first rail. The third rail is longitudinally movably connected to the second rail and is mounted with the chassis. The bracket base is connected to the first rail at a position adjacent to the front portion of the first rail. The first bracket is movably connected to the bracket base and is mounted to the first post. The second bracket is movably connected to the first rail at a position adjacent to the rear portion of the first rail and is mounted to the second post. When driven by the third rail into displacement in an extending direction, the second rail drives the first rail to displace the bracket base from a first position to a second position relative to the first bracket. Preferably, the chassis includes a first portion and a second portion, the first portion has a greater width than the second portion, and the third rail is mounted to a lateral side of the second portion of the chassis.

In some embodiments according to any of the foregoing aspects, the bracket base further includes a through hole, the first bracket further includes an opening and an engaging member, and the engaging member has an elastic arm and an engaging portion transversely connected to the elastic arm and corresponding to the opening. When the bracket base is at the second position relative to the first bracket, the engaging portion of the engaging member extends through the opening of the first bracket into the through hole of the bracket base due to an elastic force of the elastic arm and thus engages with the bracket base.

In some embodiments according to any of the foregoing aspects, the second rail has a disengaging member. In the course in which the second rail is displaced relative to the first rail from the extended position toward the retracted position, the disengaging member of the second rail pushes the engaging portion of the engaging member in a disengaging direction and the bracket base brings the engaging portion of the engaging member out of engagement with the through hole, in order for the second rail to drive the first rail to displace the bracket base from the second position to the first position relative to the first bracket.

In some embodiments according to any of the foregoing aspects, the bracket base further includes a blocking portion, and the first bracket further includes a pressing portion. When the bracket base is at the first position relative to the first bracket, the blocking portion of the bracket base is able to be blocked by the pressing portion of the first bracket.

In some embodiments according to any of the foregoing aspects, the first bracket includes a sidewall and an end plate substantially perpendicularly connected to the sidewall, the slide rail assembly further includes at least one mounting member and a pin which are connected to the end plate, and the pin incorporates a movable, engagement-based connecting member.

In some embodiments according to any of the foregoing aspects, the bracket base further includes an upper wall, a lower wall, and a sidewall connecting between the upper wall and the lower wall; the upper wall, the lower wall, and the sidewall jointly define a channel; and the first bracket includes a sidewall which can be moved in the channel of the bracket base.

In some embodiments according to any of the foregoing aspects, the bracket base further includes an engaging hole, and the first bracket further includes a projecting portion corresponding to the engaging hole. When the bracket base is at the second position relative to the first bracket, the projecting portion of the first bracket extends into the engaging hole of the bracket base.

One of the advantageous features of applying the present invention is that the slide rail assembly has a rail and a bracket base which are displaceable relative to a bracket.

BRIEF DESCRIPTION OF THE DRAWINGS

FIG. 4A shows how a chassis is mounted to a rack via the slide rail assembly in FIG. 1, with the bracket base at a first position relative to the first bracket;

FIG. 4B shows how the second rail and the third rail of the slide rail assembly in FIG. 4A are displaced relative to the first rail;

FIG. 4C shows a state in which the second rail and the third rail of the slide rail assembly in FIG. 4B have been further displaced relative to the first rail such that the bracket base is at a second position relative to the first bracket;

FIG. 5A shows the slide rail assembly in FIG. 1 mounted to a first post, with the bracket base at the first position relative to the first bracket;

FIG. 5B shows how the second rail and the third rail of the slide rail assembly in FIG. 5A are pulled in the extending direction;

FIG. 7A shows a state in which the bracket base of the slide rail assembly in FIG. 1 is at the first position relative to the first bracket, and in which the engaging portion of the engaging member extends into the opening of the first bracket;

FIG. 7B shows a state in which the bracket base of the slide rail assembly in FIG. 7A is displaced relative to the first bracket in the extending direction;

FIG. 7C shows a state in which the bracket base of the slide rail assembly in FIG. 7A is at the second position relative to the first bracket, and in which the engaging portion of the engaging member extends into the through hole of the bracket base;

FIG. 8A shows a state in which the second rail of the slide rail assembly in FIG. 1 pushes the engaging portion of the engaging member in a disengaging direction;

FIG. 8B shows a state in which the blocking portion of the bracket base of the slide rail assembly in FIG. 8A disengages the engaging portion of the engaging member from the through hole of the bracket base;

FIG. 8C shows a state in which the bracket base in FIG. 8B is at the first position relative to the first bracket;

DETAILED DESCRIPTION OF THE INVENTION

Figure 1:
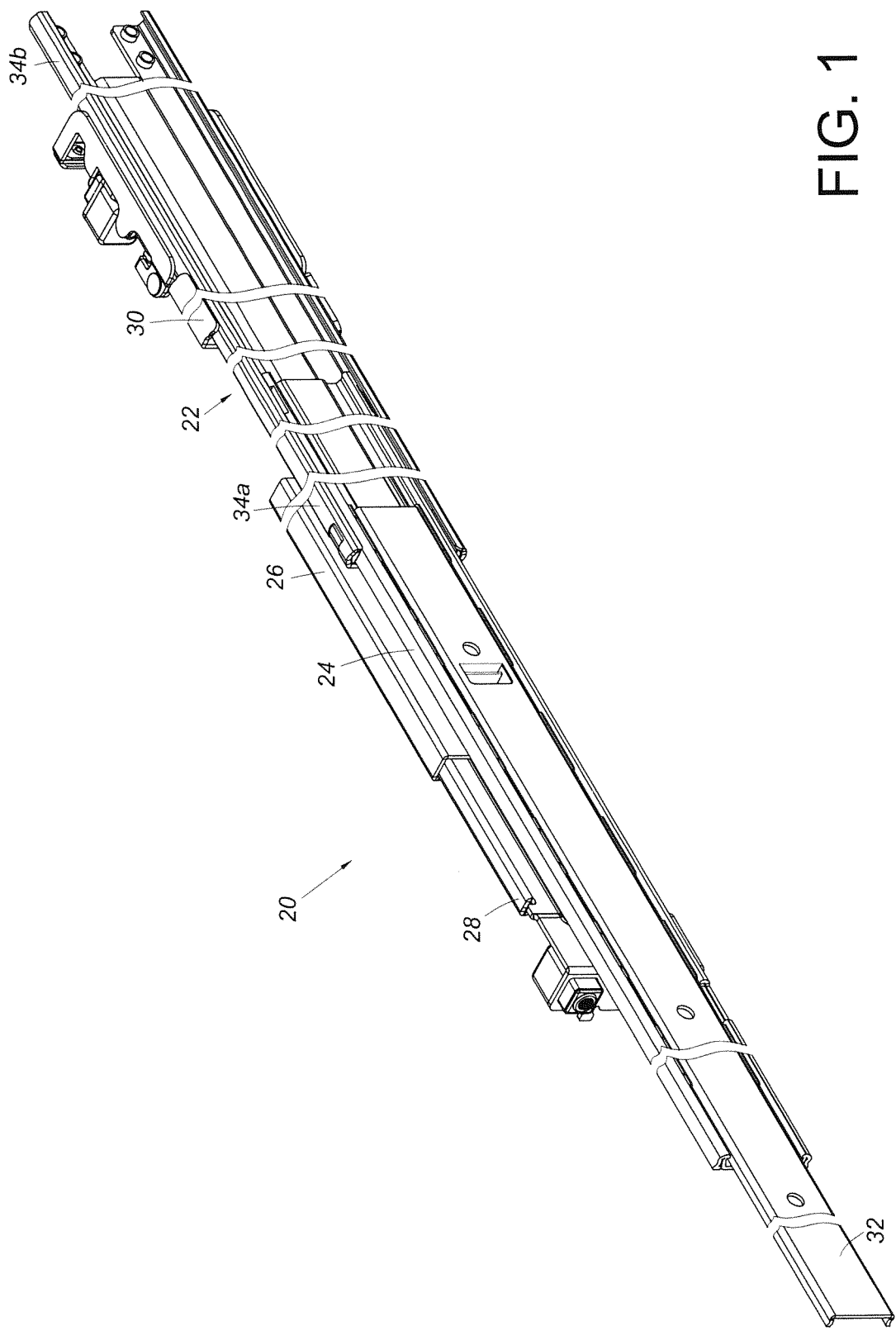
FIG. 1 is a perspective view of the slide rail assembly according to an embodiment of the present invention.

Referring to FIG. 1, a slide rail assembly 20 according to an embodiment of the present invention includes a first rail 22, a second rail 24, a bracket base 26, and a first bracket 28. In this embodiment, the slide rail assembly 20 further includes a second bracket 30 and a third rail 32. The first rail 22, the second rail 24, and the third rail 32 are sequentially connected in a longitudinally movable manner and can be brought to an extended state.

Figure 2:
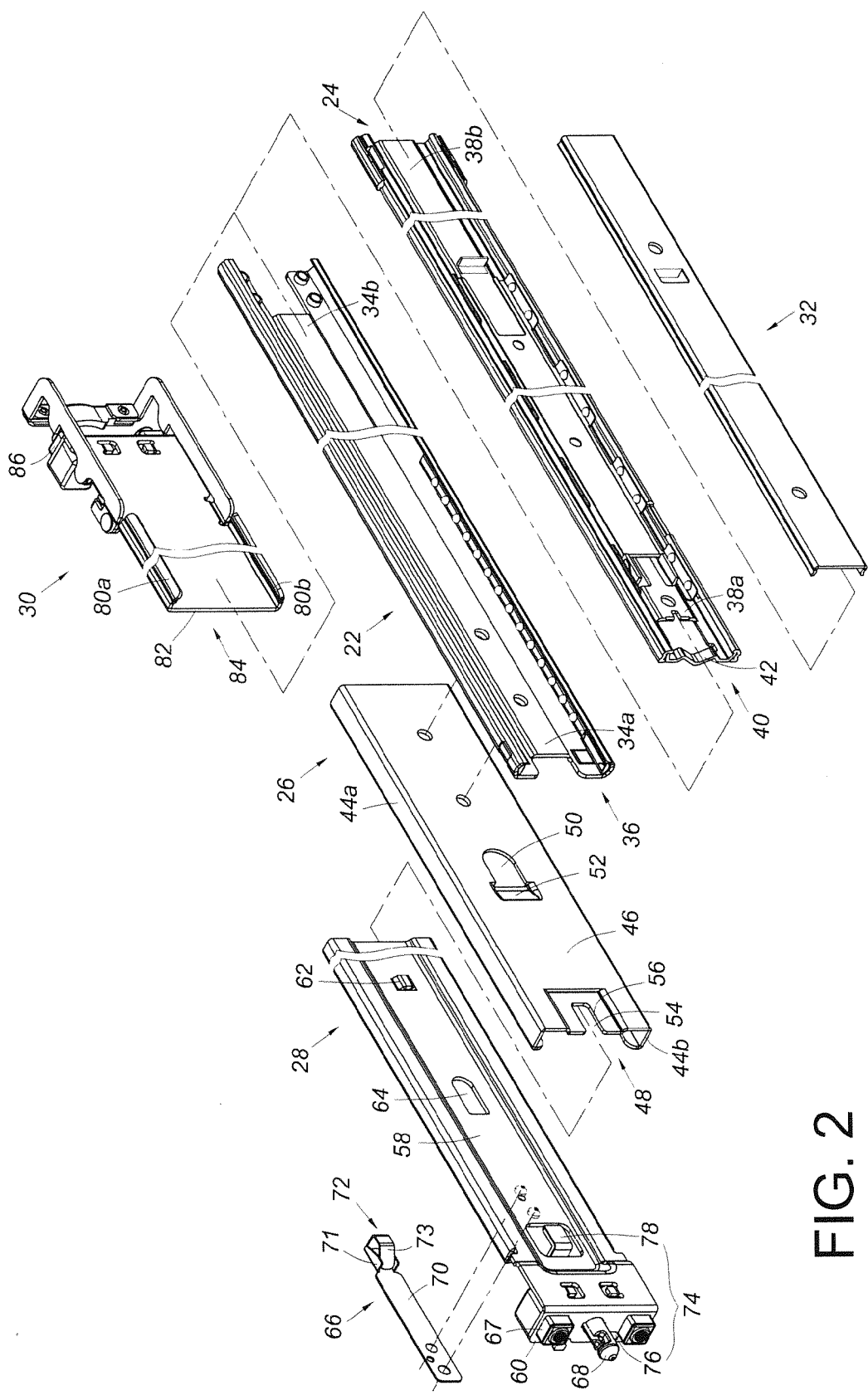
FIG. 2 is an exploded view of the slide rail assembly in FIG. 1.

As shown in FIG. 1 and FIG. 2, the first rail 22 has a front portion 34a and a rear portion 34b and defines a channel 36.

The second rail 24 is movably connected to the first rail 22 and is located in the channel 36 of the first rail 22. The second rail 24 has a front portion 38a and a rear portion 38b and defines a channel 40. In this embodiment, the second rail 24 further has a disengaging member 42. The disengaging member 42 can be, but is not necessarily, adjacent to the front portion 38a of the second rail 24.

The bracket base 26 is connected to the first rail 22. For example, the bracket base 26 can be fixedly connected to the first rail 22 at a position adjacent to the front portion 34a by riveting, threaded connection, soldering, or engagement between components, among other connection means. Alternatively, the bracket base 26 can be formed integrally with the first rail 22 and therefore be viewed as a part of the first rail 22. In practice, there are no limitations on the mode of connection between the bracket base 26 and the first rail 22. The bracket base 26 further includes an upper wall 44a, a lower wall 44b, and a sidewall 46 connecting between the upper wall 44a and the lower wall 44b. The upper wall 44a, the lower wall 44b, and the sidewall 46 jointly define a channel 48. Here, the bracket base 26 further includes a through hole 50, a blocking portion 52 adjacent to the through hole 50, a recess 54, and at least one blocking wall 56 adjacent to the recess 54. The through hole 50, the blocking portion 52, the recess 54, and the at least one blocking wall 56 are located at the sidewall 46 of the bracket base 26 but are not necessarily so.

The first bracket 28 is movably connected to the bracket base 26. The first bracket 28 includes a sidewall 58 and an end plate 60 substantially perpendicularly connected to the sidewall 58, wherein the sidewall 58 is movable in the channel 48 of the bracket base 26. In this embodiment, the first bracket 28 also includes a pressing portion 62, an opening 64, an engaging member 66, at least one mounting member 67, and a pin 68. More specifically, the pressing portion 62 and the opening 64 are located at the sidewall 58. The engaging member 66 is elastically connected to the sidewall 58 and can therefore be regarded as a part of the first bracket 28. The engaging member 66 has an elastic arm 70 and an engaging portion 72 transversely connected to the elastic arm 70 and corresponding to the opening 64. The engaging portion 72 includes at least one engaging section 71 and a sloped surface 73 adjacent to the at least one engaging section 71. The at least one mounting member 67 and the pin 68 are connected to the end plate 60. The pin 68 incorporates a movable, engagement-based connecting member 74. The engagement-based connecting member 74 includes an engagement-based connecting portion 76 and a releasing portion 78. The releasing portion 78 can be used to operate (i.e., move) the engagement-based connecting portion 76 so that the engagement-based connecting portion 76 is retractable into the pin 68.

The second bracket 30 is movably connected to the first rail 22 at a position adjacent to the rear portion 34b. The second bracket 30 includes an upper wall 80a, a lower wall 80b, and a sidewall 82 connecting between the upper wall 80a and the lower wall 80b. The upper wall 80a, the lower wall 80b, and the sidewall 82 jointly define a channel 84. The second bracket 30 is movably mounted, via the channel 84, to the first rail 22 at a position adjacent to the rear portion 34b such that the second bracket 30 and the first rail 22 can be longitudinally displaced relative to each other. The second bracket 30 has at least one mounting member 86.

The third rail 32 is movably connected to the second rail 24 and is located in the channel 40 of the second rail 24.

Figure 3:
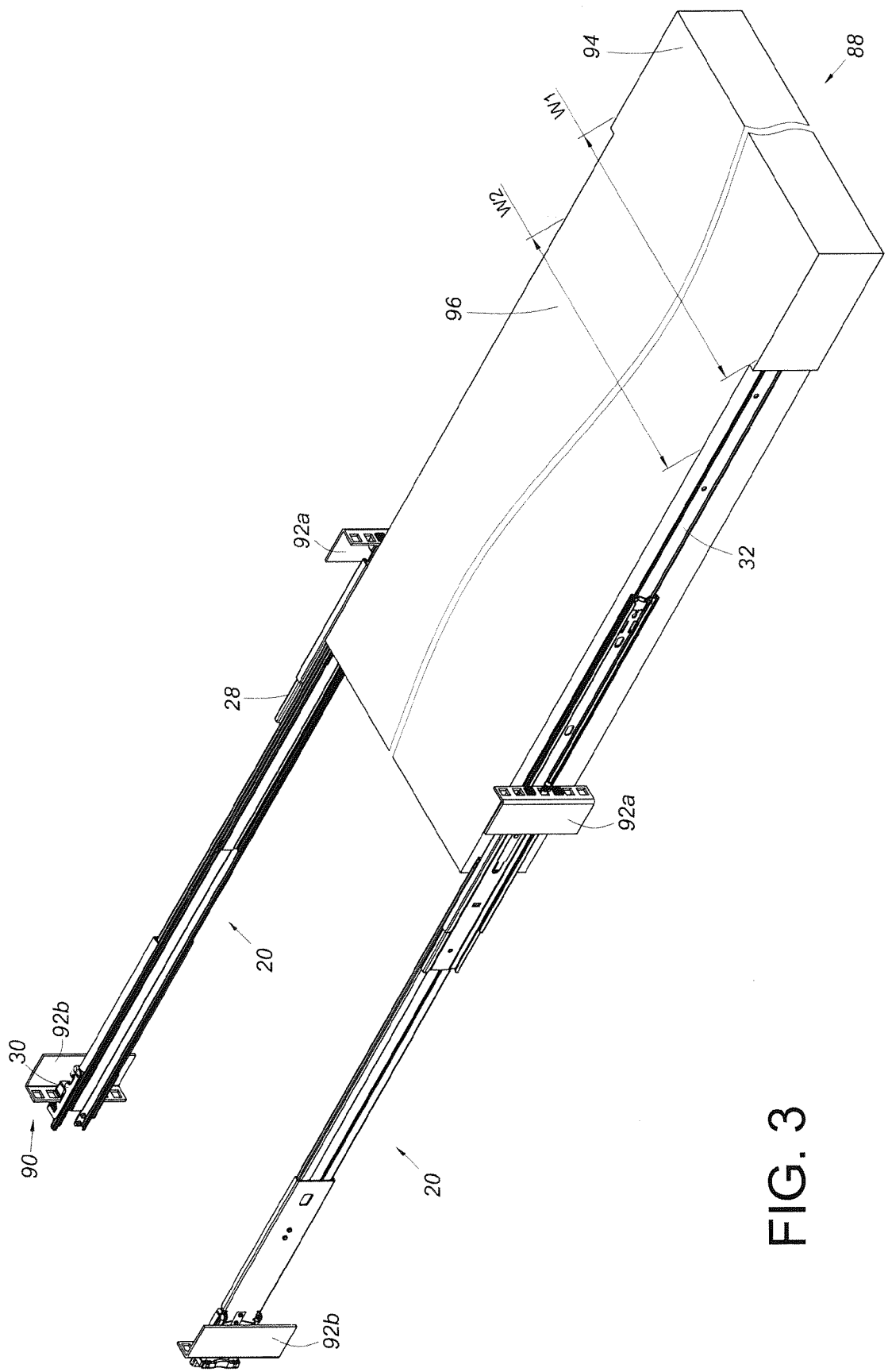
FIG. 3 shows how the slide rail assembly in FIG. 1 is used to mount a chassis to a rack so that the chassis can be pulled out of the rack.

Referring to FIG. 3, a chassis 88 is mounted to a rack 90 by a pair of slide rail assemblies 20. The rack 90 includes two pairs of posts (e.g., two corresponding first posts 92a and two corresponding second posts 92b). Each slide rail assembly 20 has two portions (e.g., the front portion and the rear portion) mounted to one of the first posts 92a and one of the second posts 92b of the rack 90 via the first bracket 28 and the second bracket 30 respectively and is thus mounted to the rack 90. More specifically, the chassis 88 is mounted to the third rails 32 of the slide rail assemblies 20. In this embodiment, the chassis 88 is a generally T-shaped chassis. For example, the chassis 88 includes a first portion 94 and a second portion 96. The first portion 94 has a width W1, and the second portion 96 has a width W2, wherein the width W1 is greater than the width W2.

Referring to FIG. 4A, the chassis 88 is mounted to the rack 90 via the slide rail assembly 20, which, as shown in the drawing, is at a retracted position. More specifically, the aforesaid two portions of the slide rail assembly 20 are mounted to the first post 92a and the second post 92b via the mounting member 67 of the first bracket 28 and the mounting member 86 of the second bracket 30 respectively. In FIG. 4A, the bracket base 26 is at a first position P1 relative to the first bracket 28.

Referring to FIG. 4B, the second rail 24 and the third rail 32, when pulled out relative to the first rail 22 (i.e., when pulled in an extending direction D1 from the retracted position toward an extended position), are displaced relative to the first rail 22 and are hence gradually extended. As the width W1 of the first portion 94 of the chassis 88 is greater than the width W2 of the second portion 96 of the chassis 88, the first portion 94 has an additional thickness T as compared with the second portion 96, and because of that, the third rail 32 of the slide rail assembly 20 can only be mounted to a lateral side 98 of the second portion 96 of the chassis 88.

Referring to FIG. 4C, when the second rail 24 and the third rail 32 are further pulled relative to the first rail 22 in the extending direction D1, the third rail 32 drives the second rail 24 further. Once displaced in the extending direction D1 to a predetermined position, the second rail 24 drives the first rail 22 to displace the bracket base 26 from the first position P1 to a second position P2 relative to the first bracket 28. That is to say, by means of the bracket base 26, the first rail 22 can be displaced relative to the first bracket 28 in the extending direction D1. Thus, the distance by which the chassis 88 can be pulled out of the rack 90 is increased, and the first rail 22 is supported by the bracket base 26 while the chassis 88 is being pulled in the extending direction D1. This allows the chassis 88 having a specific shape (e.g., a T shape) and mounted to the rack 90 to be operated as needed.

Referring to FIG. 5A, the slide rail assembly 20 is mounted to the first post 92a via the first bracket 28, with the engagement-based connecting portion 76 jutting out of the pin 68 to correspond to and can be blocked by a wall of the first post 92a. In FIG. 5A, the second rail 24 and the third rail 32 are at the retracted position relative to the first rail 22, and the bracket base 26 is at the first position P1 relative to the first bracket 28. When the bracket base 26 is at the first position P1, the blocking portion 52 of the bracket base 26 can be blocked by the pressing portion 62 of the first bracket 28.

In FIG. 5B, the second rail 24 and the third rail 32 are gradually extended as they are pulled in the extending direction D1 from the retracted position relative to the first rail 22.

Figures 6A, 6B:
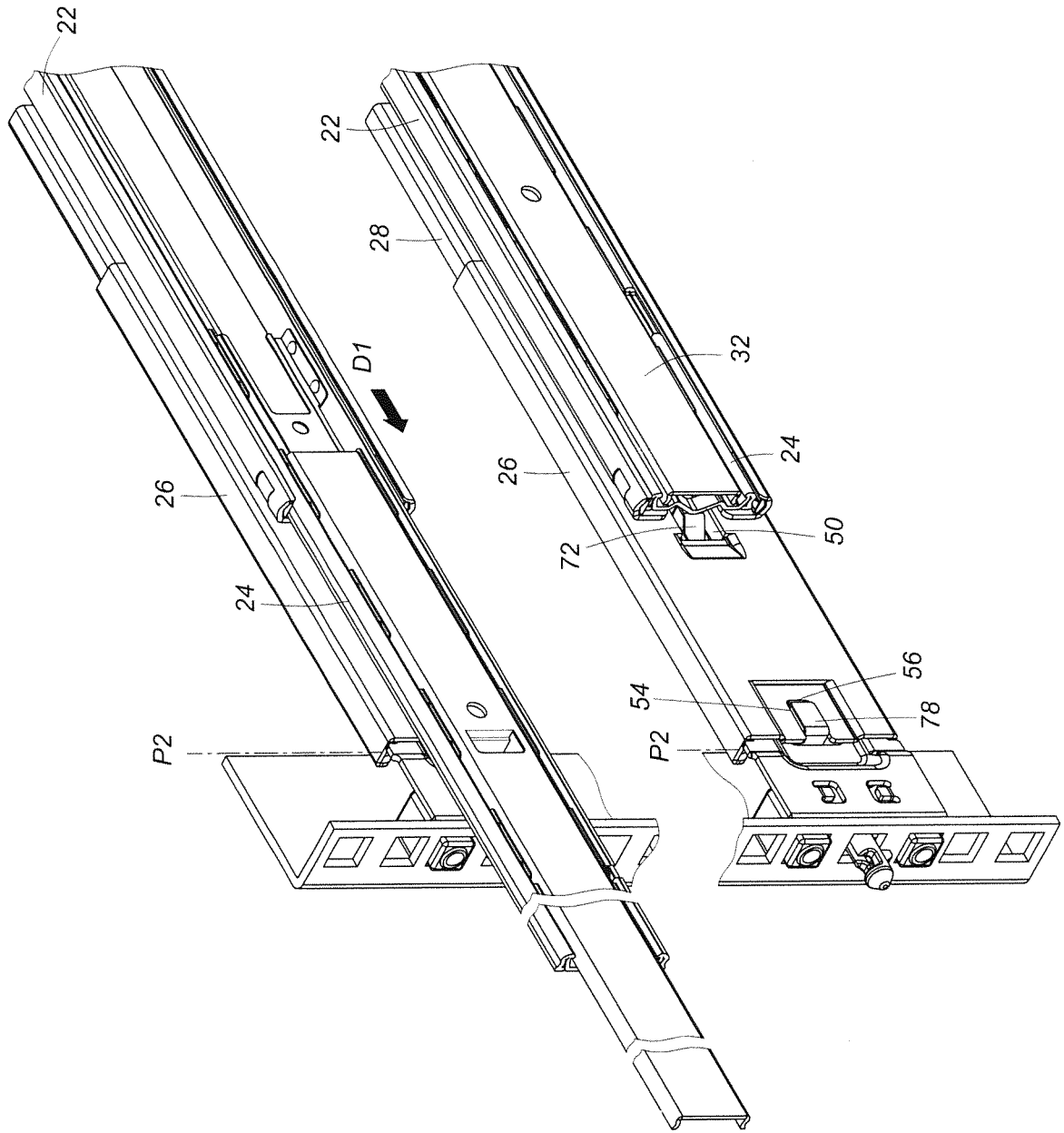
FIG. 6A shows a state in which the slide rail assembly in FIG. 1 is mounted to the first post, and in which the bracket base is at the second position relative to the first bracket.
FIG. 6B shows a state in which the bracket base in FIG. 6A remains at the second position relative to the first bracket, and in which the engaging portion of the engaging member extends into the through hole of the bracket base to engage with the bracket base.

Referring to FIG. 6A, the second rail 24 has been further displaced in the extending direction D1 to the predetermined position and therefore has begun driving the first rail 22. In fact, the bracket base 26 in FIG. 6A has been displaced along with the first rail 22 to the second position P2.

Referring to FIG. 6B, when the bracket base 26 is at the second position P2, the second rail 24 and the third rail 32 can be retracted relative to the first rail 22. More specifically, when the bracket base 26 is at the second position P2, the engaging portion 72 of the engaging member 66 extends from the first bracket 28 into the through hole 50 of the bracket base 26 and engages with the bracket base 26. In addition, when the bracket base 26 is at the second position P2 relative to the first bracket 28, the recess 54 corresponds to the releasing portion 78 such that the releasing portion 78 can be blocked by the at least one blocking wall 56. It is worth mentioning that, when the bracket base 26 is at the second position P2, the second rail 24 and the third rail 32 can be retracted in a retracting direction such that the second rail 24 drives the first rail 22 and consequently the bracket base 26 and thereby brings the bracket base 26 from the second position P2 back to the first position P1 (see FIG. 5A).

In FIG. 7A, the engaging portion 72 of the engaging member 66 corresponds to and extends into the opening 64 of the first bracket 28. More specifically, when the bracket base 26 is at the first position P1 relative to the first bracket 28, the blocking portion 52 of the bracket base 26 can be pressed against the pressing portion 62 of the first bracket 28.

Referring to FIG. 7B, in the course in which the second rail 24 and the third rail 32 are longitudinally displaced relative to the first rail 22 in the extending direction D1 from the retracted position toward the extended position, the second rail 24 begins driving the first rail 22 upon reaching the predetermined position. As a result, the bracket base 26 is displaced by the first rail 22 in the extending direction D1 from the first position P1 relative to the first bracket 28.

Referring to FIG. 7C, in the course in which the first rail 22 is further driven by the second rail 24 in the extending direction D1, the blocking portion 52 of the bracket base 26 is moved past the engaging portion 72, and the bracket base 26 is displaced to the second position P2 relative to the first bracket 28. More specifically, when the bracket base 26 is at the second position P2, the engaging portion 72 of the engaging member 66 extends through the opening 64 of the first bracket 28 into the through hole 50 of the bracket base 26 due to the elastic force of the elastic arm 70, and the engaging section 71 of the engaging member 66 is pressed against the blocking portion 52 and thus engages with the bracket base 26.

Referring to FIG. 8A to FIG. 8C, in the course in which the second rail 24 is longitudinally displaced relative to the first rail 22 in a retracting direction D2 from the extended position toward the retracted position, the disengaging member 42 of the second rail 24 pushes the engaging portion 72 of the engaging member 66 in a disengaging direction D3 such that the engaging section 71 of the engaging portion 72 is moved away from the blocking portion 52 of the bracket base 26. In addition, the blocking portion 52 of the bracket base 26 is able to push the sloped surface 73 of the engaging portion 72 and thus move the engaging portion 72 of the engaging member 66 in the disengaging direction D3, bringing the engaging portion 72 of the engaging member 66 out of engagement with the through hole 50 of the bracket base 26. Consequently, the second rail 24 displaces the first rail 22 in the retracting direction D2, and the first rail 22, in turn, displaces the bracket base 26 from the second position P2 to the first position P1.

Figures 9A, 9B:
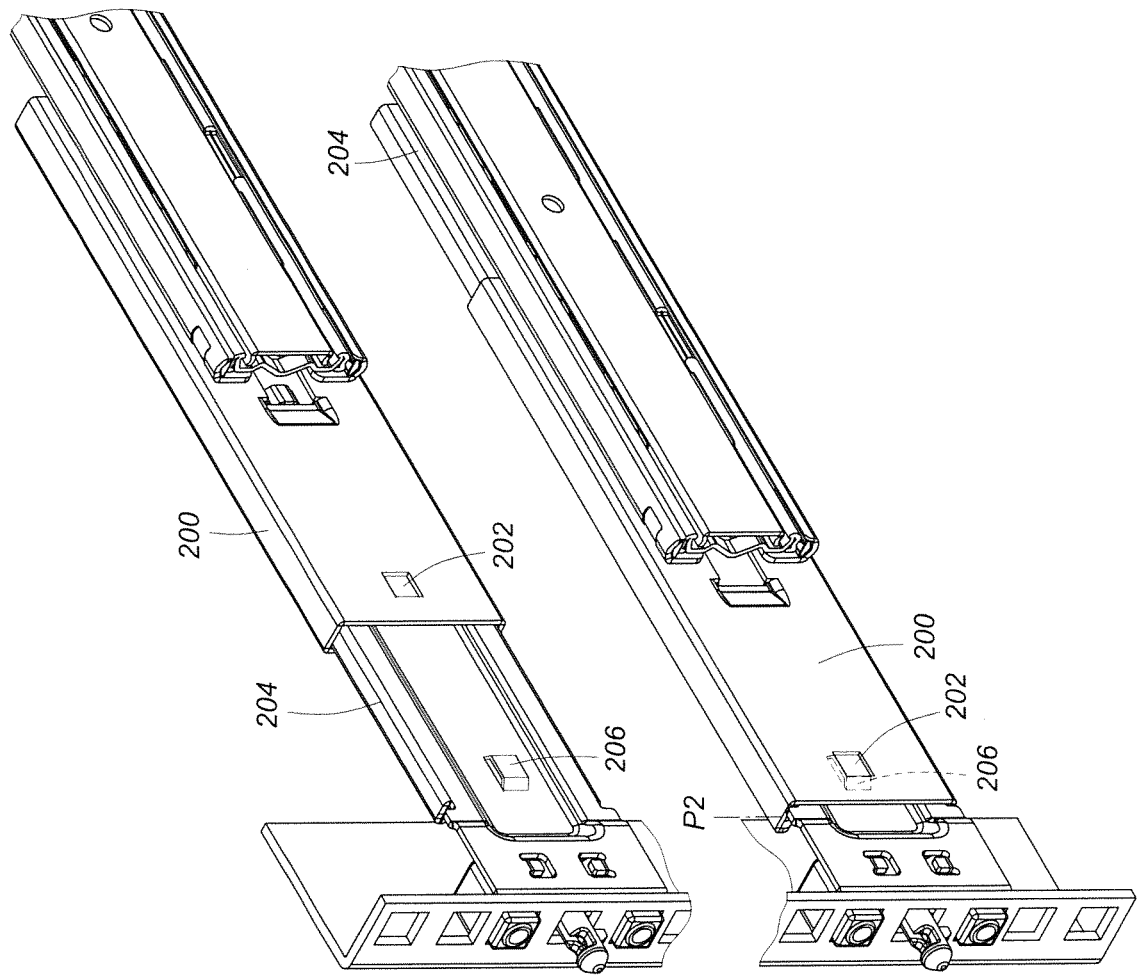
FIG. 9A shows how the slide rail assembly according to another embodiment of the present invention is mounted to the first post, with the bracket base at a certain position relative to the first bracket.
FIG. 9B shows a state in which the bracket base in FIG. 9A is at another position relative to the first bracket, and in which the projecting portion of the first bracket extends into the engaging hole of the bracket base.

FIG. 9A and FIG. 9B show the slide rail assembly according to another embodiment of the present invention. This embodiment differs from the previous one substantially in that the bracket base 200 includes an engaging hole 202 and that the first bracket 204 includes a projecting portion 206 corresponding to the engaging hole 202. When the bracket base 200 is at the second position P2 relative to the first bracket 204, the projecting portion 206 of the first bracket 204 extends into the engaging hole 202 of the bracket base 200 to engage with the bracket base 200.

While the present invention has been disclosed by way of the preferred embodiments described above, the embodiments are not intended to be restrictive of the present invention. The scope of patent protection sought by the applicant is defined by the appended claims.

The invention claimed is:

1. A slide rail assembly, comprising:
   a first rail;
   a bracket base connected to the first rail;
   a first bracket having the bracket base movably connected thereto;
   a second bracket longitudinally offset from the first bracket, the second bracket movably supporting the first rail to remain laterally offset from the first bracket; and
   a second rail movably connected to the first rail and longitudinally displaceable relative to the first rail, wherein the first rail is drivable responsive to the second rail to displace the bracket base relative to the first bracket.

2. The slide rail assembly of claim 1, wherein the first rail defines a channel; the second rail is longitudinally displaceable in the channel of the first rail between a retracted position and an extended position relative to the first rail; and while being displaced in an extending direction from the retracted position toward the extended position relative to the first rail, the second rail drives the first rail to displace the bracket base from a first position to a second position relative to the first bracket.

3. The slide rail assembly of claim 1, wherein the first rail has a front portion and a rear portion, the bracket base is connected to the first rail at a position adjacent to the front portion of the first rail, and the second bracket is movably connected to the first rail at a position adjacent to the rear portion of the first rail.

4. The slide rail assembly of claim 2, wherein the bracket base further includes a through hole, the first bracket further includes an opening and an engaging member, the engaging member has an elastic arm and an engaging portion transversely connected to the elastic arm and corresponding to the opening, and when the bracket base is at the second position relative to the first bracket, the engaging portion of the engaging member extends through the opening of the first bracket into the through hole of the bracket base due to an elastic force of the elastic arm and engages with the bracket base.

5. The slide rail assembly of claim 4, wherein the second rail further has a disengaging member, and while the second rail is being displaced from the extended position toward the retracted position relative to the first rail, the disengaging member of the second rail pushes the engaging portion of the engaging member in a disengaging direction and the bracket base brings the engaging portion of the engaging member out of engagement with the through hole, in order for the second rail to drive the first rail to displace the bracket base from the second position to the first position relative to the first bracket.

6. The slide rail assembly of claim 2, wherein the bracket base further includes a blocking portion, the first bracket further includes a pressing portion, and when the bracket base is at the first position relative to the first bracket, the blocking portion of the bracket base is able to be blocked by the pressing portion of the first bracket.

7. The slide rail assembly of claim 1, wherein the first bracket includes a sidewall and an end plate substantially perpendicularly connected to the sidewall, the slide rail assembly further includes at least one mounting member and a pin which are connected to the end plate, and the pin incorporates a movable, engagement-based connecting member.

8. The slide rail assembly of claim 1, wherein the bracket base further includes an upper wall, a lower wall, and a sidewall connecting between the upper wall and the lower wall; the upper wall, the lower wall, and the sidewall jointly define a channel; and the first bracket includes a sidewall movable in the channel of the bracket base.

9. The slide rail assembly of claim 2, wherein the bracket base further includes an engaging hole, the first bracket further includes a projecting portion corresponding to the engaging hole, and when the bracket base is at the second position relative to the first bracket, the projecting portion of the first bracket extends into the engaging hole of the bracket base.

10. A slide rail assembly adapted to mount a chassis to a rack, the rack including a first post and a second post, the slide rail assembly comprising:
a first rail having a front portion and a rear portion and defining a channel;
a second rail movably connected to the first rail and longitudinally displaceable in the channel of the first rail between a retracted position and an extended position relative to the first rail;
a third rail movably connected to the second rail and mounted with the chassis;
a bracket base connected to the first rail at a position adjacent to the front portion of the first rail;
a first bracket having the bracket base movably connected thereto, the first bracket being mounted to the first post; and
a second bracket having the first rail movably connected thereto at a position adjacent to the rear portion of the first rail, the second bracket being mounted to the second post;
wherein while being pulled out relative to the first rail, the third rail drives the second rail into displacement in an extending direction from the retracted position toward the extended position relative to the first rail, and during the displacement, the second rail drives the first rail to displace the bracket base from a first position to a second position relative to the first bracket.

11. The slide rail assembly of claim 10, wherein the chassis includes a first portion and a second portion, the first portion has a width greater than a width of the second portion, and the third rail is mounted to a lateral side of the second portion of the chassis.

12. A slide rail assembly adapted to mount a chassis to a rack, the rack including a first post and a second post, the slide rail assembly comprising:
a first rail having a front portion and a rear portion;
a second rail longitudinally movably connected to the first rail;
a third rail longitudinally movably connected to the second rail and mounted with the chassis;
a bracket base connected to the first rail at a position adjacent to the front portion of the first rail;
a first bracket having the bracket base movably connected thereto, the first bracket being mounted to the first post; and
a second bracket having the first rail movably connected thereto at a position adjacent to the rear portion of the first rail, the second bracket being mounted to the second post;
wherein when driven by the third rail into displacement in an extending direction, the second rail drives the first rail to displace the bracket base from a first position to a second position relative to the first bracket.

13. The slide rail assembly of claim 12, wherein the chassis includes a first portion and a second portion, the first portion has a width greater than a width of the second portion, and the third rail is mounted to a lateral side of the second portion of the chassis.

14. The slide rail assembly of claim 12, wherein the bracket base further includes an upper wall, a lower wall, and a sidewall connecting between the upper wall and the lower wall; the upper wall, the lower wall, and the sidewall jointly define a channel; the first bracket includes a sidewall and an end plate substantially perpendicularly connected to the sidewall; and the sidewall of the first bracket is movable in the channel of the bracket base.

* * * * *